United States Patent [19]

Koike

[11] Patent Number: 5,335,354
[45] Date of Patent: Aug. 2, 1994

[54] DEMODULATION CIRCUIT HAVING AUTOMATIC FREQUENCY CONTROL FUNCTION

[75] Inventor: Masatoshi Koike, Sagamihara, Japan

[73] Assignees: Kabushiki Kaisha Toshiba, Kawasaki; Toshiba Audio Video Engineering Co., Limited, Tokyo, both of Japan

[21] Appl. No.: 798,132

[22] Filed: Nov. 26, 1991

[30] Foreign Application Priority Data

Nov. 27, 1990 [JP] Japan .................................. 2-320894

[51] Int. Cl.$^5$ ............................................... H04B 1/16
[52] U.S. Cl. .............................. 455/192.2; 455/182.2; 455/259; 455/265
[58] Field of Search ............... 455/192.1, 192.2, 192.3, 455/196.1, 182.1, 182.2, 182.3, 260, 315, 316, 317, 183.1, 183.2, 208, 255-259, 263-266; 375/96, 97

[56] References Cited

U.S. PATENT DOCUMENTS

| | | | |
|---|---|---|---|
| 4,112,372 | 9/1978 | Holmes et al. | 375/96 |
| 4,237,556 | 12/1980 | Naito | 455/196.1 |
| 4,658,438 | 4/1987 | Kamata et al. | 455/264 |
| 5,109,544 | 4/1992 | Mittel et al. | 455/192.2 |
| 5,132,799 | 7/1992 | Gakumura | 455/192.1 |

Primary Examiner—Edward F. Urban
Assistant Examiner—Nguyen Vo
Attorney, Agent, or Firm—Finnegan, Henderson, Farabow, Garrett & Dunner

[57] ABSTRACT

A demodulation circuit having an automatic frequency control (AFC) function in which a received input high frequency signal is mixed with a first reference signal to once form an intermediate frequency signal, the intermediate frequency signal is then mixed with a second reference signal having an adjustable frequency through such a frequency correction unit as a matched filter unit to obtain a demodulation signal having a maximum power value kept as a base band signal. For the purpose of preventing the failure of maintaining the AFC function caused by the limited correctable range of the frequency correction unit such as the matched filter unit, when the correctable range of the frequency correction unit reaches its limit, the frequency of the first reference signal is separately adjusted to thereby keep the frequency of the intermediate frequency signal always within the correctable range of the frequency correction unit.

2 Claims, 3 Drawing Sheets

| Δf / | -2Δf | -Δf | ±0 | +Δf | +2Δf |
|---|---|---|---|---|---|
| CORRELATION COEFFICIENT | K5 | K3 | K1 | K2 | K4 |

FIG. 6 *(PRIOR ART)*

DEMODULATION CIRCUIT HAVING AUTOMATIC FREQUENCY CONTROL FUNCTION

BACKGROUND OF THE INVENTION

1. Field of the Invention

The present invention relates to a demodulation circuit which is used in a receiver, such as a mobile radio transceiver, and more particularly, to an improvement in a demodulation circuit which has an automatic frequency control (AFC) function of automatically controlling the frequency of a received signal having an intermediate frequency dropped from an original frequency of the received signal within a predetermined frequency range in order to maintain the signal to be demodulated at a high quality.

2. Description of the Related Art

FIG. 6 is a block diagram of an example of a prior art demodulation circuit of the type referred to. The demodulation circuit of FIG. 6 includes a mixer 1 for mixing input signals having different frequencies and outputting a mixture signal thereof, first and second band pass filters 2 and 4 for passing therethrough only signals in a predetermined frequency range, a quadrature demodulator 3 for demodulating an intermediate frequency signal passed through the first pass filter 2, first and second reference oscillators 5 and 6 (second reference oscillator 6 being of a variable frequency type) each comprising, e.g., a crystal oscillator for oscillating a reference signal having a reference frequency for demodulation of a received signal, a synthesizer 7 for generating and outputting a signal having a predetermined frequency on the basis of the reference signal oscillated at the first reference oscillator 5, a matched filter unit 8 for correcting the oscillation frequency of the second reference oscillator 6 so that an input signal has a maximum power value, an antenna 10 for receiving radio waves, and a modem 11 for converting a signal demodulated through the quadrature demodulator 3 as a base band signal into, e.g., a digital signal and then for performing a predetermined modulating-/demodulating operation over the base band signal.

With such a demodulation circuit as mentioned above, when the antenna 10 catches radio waves, the caught waves are applied to the mixer 1 as a high frequency signal 100 and then mixed in the mixer 1 with a signal 200 having a predetermined frequency received from the synthesizer 7.

As a result of the mixing operation, an intermediate frequency signal 300 having an intermediate frequency of, for example, about 80 MHz is output from the mixer 1. The intermediate frequency signal 300 is subjected at the first band pass filter 2 to a filtering operation and then sent to the quadrature demodulator 3.

The quadrature demodulator 3 functions to mix the received intermediate frequency signal 300 and a reference signal oscillated at the second reference oscillator 6 of the variable frequency type to generate a base band signal 400. The demodulated base band signal 400 is subjected at the second band pass filter 4 to a predetermined filtering operation and then applied to the modem 11 and also to the matched filter unit 8.

The matched filter unit 8, as explained above, is used to check the power value of the input signal 400 and to correct the oscillation frequency of the second reference oscillator 6 in such a manner that the input signal 400 has a maximum power value. In more detail, the matched filter unit 8:

(1) Checks the power value of the input signal 400.

(2) Outputs a control signal 50 for shifting the frequency of the oscillation signal of the second reference oscillator 6 by such an amount that causes shift of the frequency of the signal 400 by a small frequency amount of $\Delta f$.

(3) Re-checks the power value of the signal 400 having a frequency shifted by the amount of $\Delta f$ and compares the current and previous signals 400 with respect to their power values.

(4) When the comparison proves an increase in the power value, the unit 8 repetitively performs the above processing (2) to shift the frequency of the signal 400 in the same direction as above and performs the above comparing operation (3).

(5) When the comparison proves a decrease in the power value, the unit 8 re-performs the above processing (2) to shift the frequency of the signal 400 in the opposite direction from above and performs the above comparing operation (3).

That is, the matched filter unit 8 repetitively carries out such operations as mentioned above.

The signal 400 demodulated as the base band signal and then applied to the modem 11 in this way always has a maximum power level and is maintained at a high level in quality.

Such an automatic frequency control (AFC) function is useful for enhancing and maintaining the quality of the demodulated signal. However, the aforementioned prior art circuit has a defect that, when such a change in the oscillation frequency output from the first reference oscillator 5 causes fluctuations of the frequency of the intermediate signal 300, the normal AFC function of this circuit cannot be ensured.

In more detail, since the aforementioned frequency correction of the matched filter unit 8 provides a definite shift width, if the frequency of the intermediate frequency signal 300 exceeds the correctable range of the matched filter unit 8 for some reason, then the demodulation circuit cannot accurately detect the maximum power value of the signal 400 and thus the AFC function thereof cannot operate normally.

The above defect can be avoided by enlarging the shift width for the frequency correction of the matched filter unit 8, but this requires increase of the number of gates to be used in the matched filter unit 8, which results in that the circuit becomes complicated and expensive.

SUMMARY OF THE INVENTION

In view of such circumstances, it is an object of the present invention to provide a demodulation circuit having an automatic frequency control (AFC) function which, even when the frequency of an intermediate frequency exceeds the frequency correctable range of a matched filter unit, can reliably correct it in a simple manner and can maintain the AFC function normally.

In accordance with an aspect of the present invention, in order to attain the above object, a demodulation circuit having an automatic frequency control (AFC) function of present invention comprises the following means (a) to (d):

(a) First frequency conversion means including a reference oscillator, a synthesizer and a mixer for mixing an input high frequency signal and a first reference signal to generate an intermediate frequency signal.

(b) Second frequency conversion means including another reference oscillator and another quadrature demodulator for mixing the generated intermediate frequency signal and a second reference signal to obtain a demodulation signal as a base band signal.

(c) First frequency correction means including a matched filter unit for monitoring a power value of the obtained demodulation signal and for correcting a frequency of the second reference signal to have its maximum value.

(d) Second frequency correction means for monitoring whether or not frequency correcting operation of the first frequency correction means is being normally executed within its correctable range and when judging that the frequency correcting operation of the first frequency correction means is not being normally executed, for correcting a frequency of the first reference signal to shift a frequency of the intermediate frequency signal into the correctable range of the first frequency correction means.

Thereby, the limit of the frequency correctable range of the first frequency correction means is compensated for.

That is, when the first frequency correction means (c) including the matched filter unit itself is not modified, only the normality or non-normality of the frequency correcting operation of the first frequency correction means (c) is judged through the second frequency correction means (d), and the frequency of the first reference signal of the first frequency conversion means (a) for performing frequency conversion at the previous stage of the second frequency conversion means (b) is corrected on the basis of the judgement result through the second frequency correction means (d), i.e., through a so-called another loop; the frequency of the intermediate frequency signal can be shifted into the correctable range of the first frequency correction means (c) easily, reliably and quickly.

Accordingly, even when the frequency of the intermediate frequency signal exceeds the correctable range of the first frequency correction means (c) for some reason, the automatic frequency control (AFC) function based on the second frequency conversion means (b) and the first frequency correction means (c) can be always normally maintained and a signal demodulated as the base band signal can also have always its maximum power value and can be kept high in quality.

The second frequency correction means (d) may comprise:

(d1) Detection means for detecting whether or not the frequency correcting operation of the first frequency correction means is being executed normally within its correctable range.

(d2) Correction means, when the detection means detects that the frequency correcting operation of the first frequency correction means is not being executed normally, for correcting the frequency correcting operation of the first frequency correction means to shift the frequency of the intermediate frequency signal into the correctable range of the first frequency correction means.

BRIEF DESCRIPTION OF THE DRAWINGS

FIG. 6 is a block diagram of an exemplary prior art demodulation circuit having an automatic frequency control (AFC) function.

DESCRIPTION OF THE PREFERRED EMBODIMENTS

Figure 1:
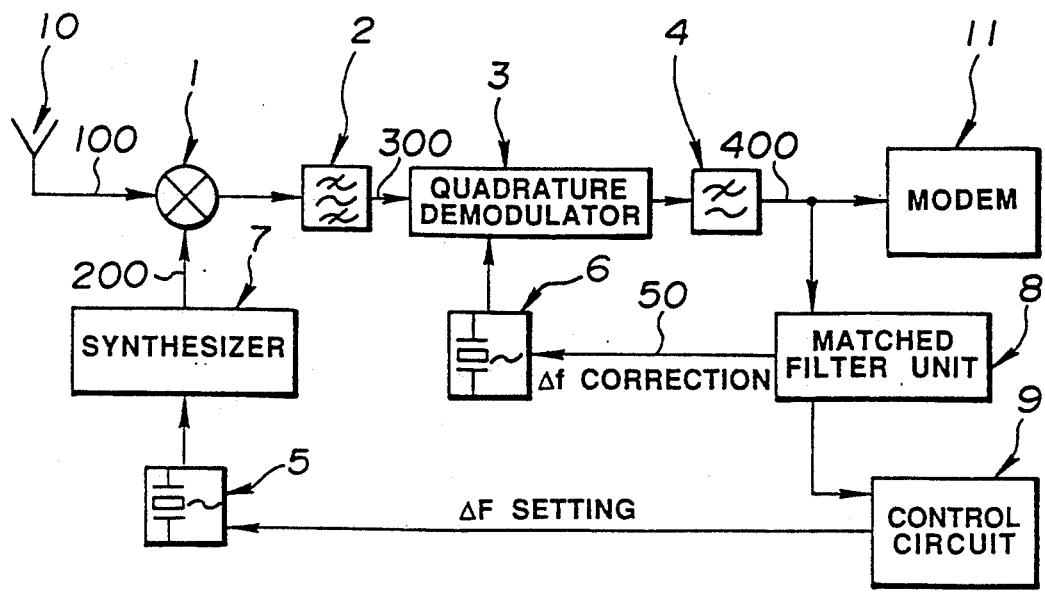
FIG. 1 is a block diagram of a demodulation circuit having an automatic frequency control (AFC) function in accordance an embodiment of the present invention.

Referring first to FIG. 1, there is shown an embodiment of a demodulation circuit having an automatic frequency control (AFC) function in accordance with the present invention.

More specifically, the circuit of the present embodiment includes a mixer 1 and a quadrature demodulator 3 for mixing input signals having different frequencies and outputting a mixture signal thereof, first and second band pass filters 2 and 4 for passing therethrough only signals in a predetermined frequency range, first and second reference oscillators 5 and 6 (in the illustrated example, both being of a variable frequency type) each comprising, e.g., a crystal oscillator for oscillating a reference signal having a reference frequency for demodulation of a received signal, a synthesizer 7 for generating and outputting a signal having a predetermined frequency on the basis of the reference signal oscillated at the first reference oscillator 5, a matched filter unit 8 for correcting the oscillation frequency of the second reference oscillator 6 so that an input signal has a maximum power value, an antenna 10 for receiving radio waves, and a modem 11 for converting a signal demodulated through the quadrature demodulator 3 as a base band signal into, e.g., a digital signal and then for performing a demodulating operation over the base band signal, as the same basic components as mentioned earlier. The demodulation circuit includes, in addition to the above components, a control circuit 9 which detects whether or not the matched filter unit 8 normally performs its frequency correcting operation within its correctable range with respect to the frequency of the base band signal to be subjected to the demodulation. The control circuit 9, when detecting the not normal execution of the frequency correcting operation, corrects the oscillation frequency of the first reference oscillator 5 to controllably shift the frequency of base band signal to be subjected to the demodulation into the correctable range of the matched filter unit 8.

Accordingly, even in the demodulation circuit of the present embodiment, so long as the frequency of the base band signal to be subjected to the demodulation lies in the correctable range of the matched filter unit 8, the demodulation circuit is basically operated so that:

(1) A high frequency signal 100 caught at the antenna 10 is sent to the mixer 1 to be mixed therein with a signal 200 having a predetermined frequency received from the synthesizer 7.

(2) An intermediate frequency signal 300 having a frequency of, e.g., about 80 MHz is output from the mixer as a result of the mixing operation.

(3) The intermediate frequency signal 300 is subjected at the first band pass filter 2 to a filtering operation and then applied to the quadrature demodulator 3.

(4) The intermediate frequency signal 300 passed through the filter 2 is mixed with a reference signal oscillated at the second reference oscillator 6 in the quadrature demodulator 3 and is output as a base band signal 400 as the demodulation signal.

(5) The signal 400 demodulated as the base band signal is subjected at the second band pass filter 4 to a predetermined filtering operation and then applied to the modem 11 and also to the matched filter unit 8.

(6) The matched filter unit 8, as explained earlier:

(61) Checks the power value of the input signal 400.

(62) Outputs a control signal 50 for shifting the frequency of the oscillation signal of the second reference oscillator 6 by such an amount that causes shift of the frequency of the signal 400 by a small frequency amount of $\Delta f$.

(63) Re-checks the power value of the signal 400 having a frequency shifted by an amount of $\Delta f$ and compares the current and previous signals 400 with respect to their power values.

(64) When the comparison indicates an increase in the power value, repetitively performs the above processing (62) to shift the frequency of the signal 400 in the same direction as above and performs the above comparing operation (63).

(65) When the comparison proves a decrease in the power value, re-performs the above processing (62) to shift the frequency of the signal 400 in the opposite direction from above and performs the above comparing operation (63).

That is, the matched filter unit 8 repetitively carries out such operations as mentioned above. Thus, the signal 400 demodulated as the base band signal and then applied to the modem 11 in this way has always a maximum power level and is maintained at a high level in quality.

The control circuit 9 of the demodulation circuit of the present embodiment receives from the matched filter unit 8 the power value of the demodulation signal 400 to be checked by the unit 8, and detects, on the basis of the power value of the received signal 400, whether or not the matched filter unit 8 is performing its frequency correcting operation normally. Explanation will be further directed mainly to the operation of the control circuit 9 and also to the function and operation of the entire demodulation circuit of the embodiment.

Figure 2:
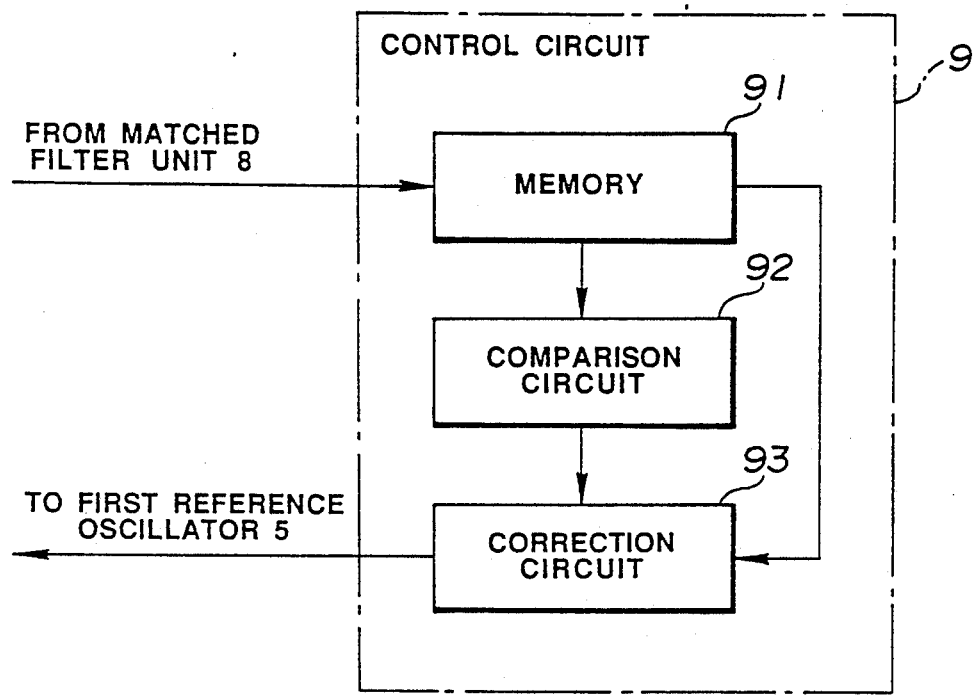
FIG. 2 is a block diagram showing a detailed example of a control circuit in FIG. 1.

Shown in FIG. 2 is a detailed structure of the control circuit 9. More specifically, the control circuit 9, as shown in FIG. 2, comprises a memory 91 for storing-therein the power value of the signal 400 received from the matched filter unit 8, a comparison circuit 92 for performing comparison over the power value stored in the memory 91, and a correction circuit 93 for controllably correcting the oscillation frequency of the first reference oscillator 5 on the basis of the comparison result of the comparison circuit 92.

Assume now that the aforementioned AFC operation (the above processing (61) to (65)) of the matched filter unit 8 causes the matched filter unit 8 to receive the demodulation signal 400 of the maximum power value. Then the control circuit 9 detects the normality or non-normality of the correcting operation of the matched filter unit 8 and performs its additional frequency correction control on the basis of the detection result in the following manner.

That is, the control circuit 9 once stores in the memory 91 the power value received from the matched filter unit 8 as "P0", and also controls the oscillation frequency of the first reference oscillator 5 under the control of the correction circuit 93 in such a manner that the then frequency value of the demodulation signal 400 is set at $\pm 0$ and the frequency of the demodulation signal 400 is shifted by an amount of (a given set value $+\Delta F$) from the set frequency value $\pm 0$.

In this way, the oscillation frequency of the first reference oscillator 5 is controlled and correspondingly the frequency of the output signal 200 of the synthesizer 7 is varied by an amount corresponding to a change in the oscillation frequency. This results in that the frequency of the intermediate frequency signal 300 as the output of the mixer 1 is varied and therefore the frequency of the demodulation signal 400 as the output of the quadrature demodulator 3 based on the intermediate frequency signal 300 is also shifted by an amount corresponding to a variation in the frequency of the signal 300. In the illustrated example, it is assumed that a shift in the frequency of the demodulation signal 400 is set to correspond to the aforementioned set value $+\Delta F$. In this connection, the set value $\Delta F$ for the frequency control of the control circuit 9 is set to be a value larger than the frequency correction value $\Delta f$ of the matched filter unit 8 and the second reference oscillator 6.

When the frequency of the demodulation signal 400 is shifted, the matched filter unit 8 performs the aforementioned processing (61) to (65) based on the demodulation signal 400 subjected to the frequency shift to attain its maximum power value and sends the attained power value to the control circuit 9 in the same manner as mentioned above.

The control circuit 9, when receiving the power value from the matched filter unit 8, separately stores in the memory 91 as "P+" the received power value in response to the frequency shift of $+\Delta F$, and then controls the oscillation frequency of the first reference oscillator 5 under the control of the correction circuit 93 in such a manner that the frequency of the demodulation signal 400 is shifted by a set value of $-\Delta F$ reversely from the frequency value of the demodulation signal 400 previously set at $\pm 0$.

Even through the above operation, a frequency shift to the demodulation signal 400 as in the above can be realized, and the matched filter unit 8 also can similarly attain its maximum power value through the aforementioned processing (61) to (65) on the basis of the demodulation signal 400 having the shifted frequency and send the attained power value to the control circuit 9.

The control circuit 9 stores in the memory 91 as "P−" the power value received from the matched filter unit 8 in response to the frequency shift of $-\Delta F$, and then compares the power values "P0", "P+" and "P−" stored in the memory 91 under the control of the comparison circuit 92.

When the comparison result of the control circuit 9 satisfies the following relationship (1), the control circuit 9 determines that the AFC function based on the aforementioned processing (61) to (65) of the matched filter unit 8 is normally working within its correctable range and controls the oscillation frequency of the first reference oscillator 5 under the control of the correction circuit 93 in such a manner that the frequency of the demodulation signal 400 is returned to the frequency at the setting of the initial value $\pm 0$. That is, in this case, no frequency correction is carried out through the control circuit 9.

$$P- < P0 > P+ \tag{1}$$

When the comparison result of the control circuit 9 satisfies the following relationship (2), on the other hand, the control circuit 9 determines that the frequency of the demodulation signal 400 is out of the correctable range of the matched filter unit 8 and the AFC function based on the matched filter unit 8 is not working normally.

$$P- < P0 < P+ \quad (2)$$

In this case, the control circuit 9 sets the previous frequency of the demodulation signal 400 at the time of the shift $+\Delta F$ newly to be $\pm 0$ and also sets the then power value "P+" to be "P0" to again shift the frequency of the demodulation signal 400 in the $+\Delta F$ and $-\Delta F$ directions, and then sets the then attached power values of the matched filter unit 8 to be "P+" and "P−" respectively for the similar comparison and judgement to the above. And the same processing is repeated until the relationship (1) is satisfied as the comparison result. The oscillation frequency of the first reference oscillator 5 is controlled through the correction circuit 93 so that, when the relationship (1) is obtained, the frequency of the demodulation signal 400 is returned to the frequency at the setting of $\pm 0$, that is, the corresponding correcting operation is completed.

Even when the following relationship (3) is satisfied as the comparison result, the control circuit 9 similarly determines that the frequency of the demodulation signal 400 is out of the correctable range of the matched filter unit 8.

$$P- > P0 > P+ \quad (3)$$

In this case, the frequency of the demodulation signal 400 at the time of being shifted by the previous amount $-\Delta F$ is set to be newly $\pm 0$, the then power value "P−" is set to be "P0" to shift the frequency of the demodulation signal 400 in the $+\Delta F$ and $-\Delta F$ directions, and the then attained power values of the matched filter unit 8 are set to be "P+" and "P−" respectively for the similar comparison and judgement. Similarly, the same processing is repeated until the relationship (1) is satisfied as the comparison result, and the oscillation frequency of the first reference oscillator 5 is controlled through the correction circuit 93 so that, when the relationship (1) is obtained, the frequency of the demodulation signal 400 is returned to the frequency at the setting of 0 (the corresponding correcting operation is completed).

In this way, in accordance with the demodulation circuit of the present embodiment, even when the frequency of the demodulation signal 400 is out of the correctable range of the matched filter unit 8, the frequency of the demodulation signal 400 can be shifted easily, reliably and quickly into the correctable range of the matched filter unit 8 under the control of the control circuit 9 and therefore the AFC function based on the matched filter unit 8 can be always normally maintained.

Figure 3:
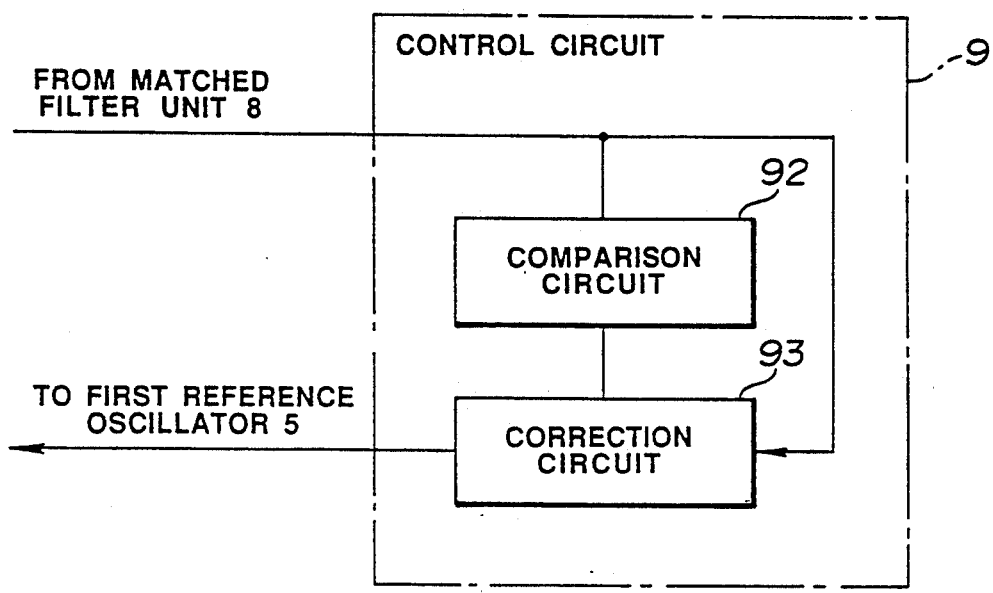
FIG. 3 is a block diagram showing another detailed example of the control circuit in FIG. 1 as a second embodiment.

The foregoing embodiment has been arranged so that the frequency of the demodulation signal 400 is shifted in the $+\Delta F$ and $-\Delta F$ directions under the control of the control circuit 9, the acquired power value through the matched filter unit 8 is then stored in the memory 91 of the control circuit 9, and thereafter the stored power values are compared to judge (detect) whether or not the AFC function realized through the matched filter unit 8 is working normally within its correctable range. However, the aforementioned frequency correction control may be executed at a time, for example, when the output characteristic of the matched filter unit 8, when the frequency of the demodulation signal 400 is shifted in its positive and negative directions with respect to a certain frequency value as a reference, is provided to the control circuit 9. In this case, the configuration of the control circuit 9 is shown in FIG. 3 and an example of the output characteristic of the matched filter unit 8 caused by such a frequency correction control is shown in FIG. 4.

Figure 4:
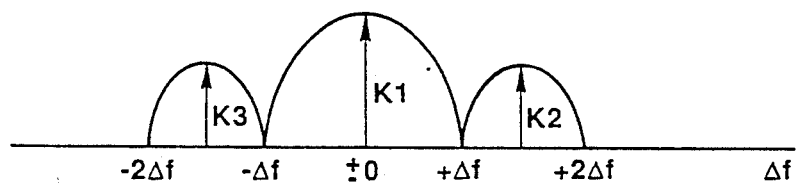
FIG. 4 is a graph showing an example of an output characteristic of a matched filter unit in FIG. 1.

In this case, more specifically, the frequency value of the demodulation signal 400 is set to be $\pm 0$, and the control circuit 9 controls the oscillation frequency of the first reference oscillator 5 through the correction circuit 93 in such a manner that the frequency of the demodulation signal 400 is shifted, for example, from $+2\Delta f$ to $-2\Delta f$, at which time the maximum power values "K1", "K2" and "K3" of the demodulation signal 400 acquired through the matched filter unit 8 are accepted at the comparison circuit 92 in such a manner as shown, for example, in FIG. 4.

And when the comparison result of the comparison circuit 92 satisfies the following relationship (4), the control circuit 9 determines that the AFC function based on the previous processing (61) to (65) of the matched filter unit 8 is normally working within its correctable range and correction control over the first reference oscillator 5 is stopped.

$$K3 < K1 \text{ and } K2 < K1 \quad (4)$$

When the following relationship (5) or (6) is satisfied as the comparison result, on the other hand, the control circuit 9 judges that the frequency of the demodulation signal 400 is out of the correctable range of the matched filter unit 8 and the AFC function based on the matched filter unit 8 is not normally working, and controls the oscillation frequency of the first reference oscillator 5 under the correction circuit 93 so as to shift the frequency of thy demodulation signal 400 in the $+\Delta f$ direction (in the case of the relationship (5)) or in the $-\Delta f$ direction (in the case of the relationship (6)).

$$K2 > K1 > K3 \quad (5)$$

$$K2 < K1 < K3 \quad (6)$$

In this way, in accordance with the second embodiment, it is possible to know the necessity or non-necessity of the correction control over the frequency of the demodulation signal 400 (the oscillation frequency of the first reference oscillator 5) and also the correction direction at the time of executing the correction control through once comparison of the control circuit 9. As a result, even when the frequency of the demodulation signal 400 is out of the correctable range of the matched filter unit 8, the frequency can be optimized more quickly.

Figure 5:
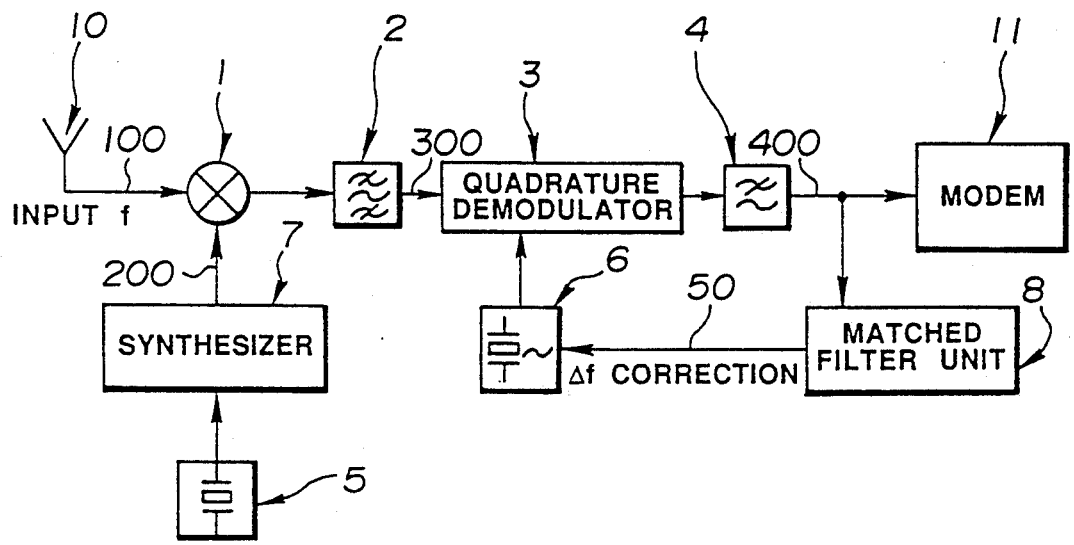
FIG. 5 is a table showing a relationship between the correction of a demodulation signal of the matched filter unit and a correlation coefficient.

FIG. 5 shows a relationship between the correction $\Delta f$ of the matched filter unit 8 and its correlation coefficient (corresponding to the maximum power value of the demodulation signal 400 in each frequency region) with respect to the output characteristic of the matched filter unit 8 as exemplified in FIG. 4.

In these embodiments, the control circuit 9 may comprise practically a microprocessor. Accordingly, the present invention can be made simpler in circuit configuration and more inexpensive than the case where the number of gates in the matched filter unit 8 is increased to expand the shift width for the frequency correction.

Although the control circuit 9 has been illustrated to comprise detection means for detecting whether or not the frequency correcting operation of the matched filter unit 8 is normally being executed within its correctable range and means, when the detection means detects the non-normal execution of the frequency correcting operation of the matched filter unit 8, for correcting the oscillation frequency of the first reference oscillator 5 and for controllably shifting the frequency of the demodulation signal 400 into the correctable range of the matched filter unit 8 in the foregoing embodiments, these means may be provided respectively independently.

Further, it has been assumed in the foregoing embodiments that, for realizing the AFC function, the matched filter unit 8 is used as means for correcting the oscillation frequency of the second reference oscillator 6 so as to have its maximum value while monitoring the power value of the demodulation signal 400. However, it goes without saying that, so long as other equivalent frequency correcting means is employed, the present invention can be applied in substantially the same manner as in these embodiments to realize the further stabilization of the AFC function.

What is claimed:

1. A demodulation circuit having an automatic frequency control function, comprising:
   first frequency conversion means for converting an input high frequency signal into an intermediate frequency signal by using a first reference signal;
   second frequency conversion means for converting the intermediate frequency signal into a base band signal by using a second reference signal;
   matched filter means for receiving the base band signal and correcting the frequency of the second reference signal so as to maximize a power value of the base band signal; and
   controlling means for detecting whether the frequency of the base band signal exceeds a correctable range of the matched filter means based on an output of the matched filter means, and correcting the frequency of the first reference signal such that the frequency of the base band signal falls within the correctable range of the matched filter means when the controlling means detects that the frequency of the base band signal exceeds the correctable range;
   said controlling means including:
      memory means for storing a first maximum power value of the base band signal controlled by the matched filter means when the frequency of the base band signal is unshifted, a second maximum power value of the base band signal controlled by the matched filter means when the frequency of the base band signal is increased by a predetermined frequency and a third maximum power value of the base band signal controlled by the matched filter means when the frequency of the base band signal is decreased by the predetermined frequency;
      comparison means for comparing the first, second and third maximum power values; and
      control means coupled to said comparison means for (1) maintaining the frequency of the base band signal when a relationship of the third maximum power value < the first maximum power value > the second maximum power value is satisfied, (2) increasing the frequency of the base band signal by the predetermined frequency when a relationship of the third maximum power value < the first maximum power value < the second maximum power value is satisfied, and (3) decreasing the frequency of the base band signal by the predetermined frequency when a relationship of the third maximum power value > the first maximum power value > the second maximum power value is satisfied.

2. A demodulation circuit having an automatic frequency control function, comprising:
   first frequency conversion means for converting an input high frequency signal into an intermediate frequency signal by using a base band signal;
   second frequency conversion means for converting the intermediate frequency signal into a base band signal by using a second reference signal;
   matched filter means for receiving the base band signal and correcting the frequency of the second reference signal so as to maximize a power value of the base band signal; and
   controlling means for detecting whether the frequency of the base band signal exceeds a correctable range of the matched filter means based on an output of the matched filter means, and correcting the frequency of the first reference signal such that the frequency of the base band signal falls within the correctable range of the matched filter means when the controlling means detects that the frequency of the base band signal exceeds the correctable range;
   said controlling means including:
      comparison means for collectively receiving from the matched filter means output characteristics of the matched filter means in a predetermined frequency range and comparing a first value corresponding to a maximum power value at a central frequency, a second value corresponding to a maximum power value at a frequency higher than the central frequency by a predetermined frequency and a third value corresponding to a maximum power value at a frequency lower than the central frequency by the predetermined frequency; and
      control means coupled to said comparison means for (1) maintaining the frequency of the base band signal when a relationship of the third value < the first value > the second value is satisfied, (2) increasing the frequency of the base band signal by the predetermined frequency when a relationship of the third value < the first value < the second value is satisfied, and (3) decreasing the frequency of the base band signal by the predetermined frequency when a relationship of the third value > the first value > the second value is satisfied.

* * * * *

UNITED STATES PATENT AND TRADEMARK OFFICE
CERTIFICATE OF CORRECTION

PATENT NO. : 5,335,354
DATED : August 02, 1994
INVENTOR(S) : Masatoshi KOIKE

It is certified that error appears in the above-indentified patent and that said Letters Patent is hereby corrected as shown below:

Claim 2, Column 10, Line 22, change "base band" to --first reference--.

Signed and Sealed this

Eleventh Day of April, 1995

Attest:

BRUCE LEHMAN

*Attesting Officer*  *Commissioner of Patents and Trademarks*